United States Patent
Udagawa (10) Patent No.: US 8,071,991 B2
(45) Date of Patent: Dec. 6, 2011

(54) LIGHT-EMITTING DIODE AND LIGHT-EMITTING DIODE LAMP

(75) Inventor: Takashi Udagawa, Chichibu (JP)

(73) Assignee: Showa Denko K.K., Tokyo (JP)

( * ) Notice: Subject to any disclaimer, the term of this patent is extended or adjusted under 35 U.S.C. 154(b) by 353 days.

(21) Appl. No.: 11/997,942

(22) PCT Filed: Aug. 3, 2006

(86) PCT No.: PCT/JP2006/315778
§ 371 (c)(1),
(2), (4) Date: Jul. 8, 2008

(87) PCT Pub. No.: WO2007/018250
PCT Pub. Date: Feb. 15, 2007

(65) Prior Publication Data
US 2009/0152579 A1   Jun. 18, 2009

(30) Foreign Application Priority Data
Aug. 5, 2005   (JP) .................. 2005-227622

(51) Int. Cl.
*H01L 33/10* (2010.01)
(52) U.S. Cl. .............. 257/98; 257/96; 257/97; 257/100; 257/E33.001; 257/E31.003; 438/22; 438/46
(58) Field of Classification Search ............... 257/9–15, 257/93–103, 189, 200, 615, 745, E33.033, 257/E33.028, E33.025, E33.023, E33.008, 257/E33.009, E33.001, E31.035, E31.036, 257/E29.074, E29.298, E29.028; 438/22, 438/46, 47
See application file for complete search history.

(56) References Cited

U.S. PATENT DOCUMENTS 3,602,778 A * 8/1971 Ura et al. ............. 257/603
5,636,234 A   6/1997 Takagi
(Continued)

FOREIGN PATENT DOCUMENTS
JP   52-61982 A   5/1977
(Continued)

OTHER PUBLICATIONS

Hiroo Yonezu, Optical Communication Device Engineering—Photoemitter/Photoreceptor Device—, First Edition: May 20, 1995, published by Kougakutosho Co., Ltd., © Hiroo Yonezu 1984, 3054-20194-2213.

*Primary Examiner* — Cuong Q Nguyen
*Assistant Examiner* — Yosef Gebreyesus
(74) *Attorney, Agent, or Firm* — Sughrue Mion, PLLC (57) ABSTRACT

The present invention provides a light-emitting diode (10) including a first conductive type silicon single crystal substrate (101), a light-emitting section (40) including a first pn junction structure composed of a III-group nitride semiconductor on the substrate, a first polarity ohmic electrode (107*b*) provided on the light-emitting section, and a second polarity ohmic electrode (108) on the same side as the light-emitting section with respect to the substrate, wherein a second pn junction structure (30) is configured in a region which extends from the substrate to the light-emitting section, the substrate is provided with a light-reflecting hole (109) from the back surface of the substrate opposite to the side on which the light-emitting section of the substrate is provided toward the stacking direction, and the inner surface of the light-reflecting hole and the back surface of the substrate are coated with a metallic film (110).

15 Claims, 4 Drawing Sheets

U.S. PATENT DOCUMENTS

| | | | |
|---|---|---|---|
| 6,078,064 A * | 6/2000 | Ming-Jiunn et al. | 257/103 |
| 6,080,599 A * | 6/2000 | Yamamoto et al. | 438/33 |
| 6,091,084 A * | 7/2000 | Fujii | 257/82 |
| 6,115,399 A * | 9/2000 | Shakuda | 372/45.01 |
| 6,468,902 B2 * | 10/2002 | Kawai | 438/667 |
| 6,593,159 B1 * | 7/2003 | Hashimoto et al. | 438/22 |
| 6,642,550 B1 * | 11/2003 | Whitworth et al. | 257/99 |
| 2002/0113235 A1 * | 8/2002 | Udagawa | 257/59 |
| 2003/0122139 A1 * | 7/2003 | Meng et al. | 257/81 |
| 2004/0063236 A1 * | 4/2004 | Kwak et al. | 438/39 |
| 2004/0095977 A1 * | 5/2004 | Nakamura et al. | 372/43 |
| 2004/0159843 A1 * | 8/2004 | Edmond et al. | 257/79 |
| 2005/0271107 A1 * | 12/2005 | Murakami et al. | 372/50.1 |
| 2006/0162768 A1 * | 7/2006 | Wanlass et al. | 136/262 |
| 2007/0121696 A1 * | 5/2007 | Ishii | 372/99 |

FOREIGN PATENT DOCUMENTS

| | | |
|---|---|---|
| JP | 08-264898 A | 10/1996 |
| JP | 09-036427 A | 2/1997 |
| JP | 10-200159 A | 7/1998 |
| JP | 2000-188425 A | 7/2000 |
| JP | 2004-153169 A | 5/2004 |
| JP | 2005-20038 A | 1/2005 |
| JP | 2005-057228 A | 3/2005 |
| JP | 2005-93991 A | 4/2005 |

* cited by examiner

LIGHT-EMITTING DIODE AND LIGHT-EMITTING DIODE LAMP

CROSS REFERENCE TO RELATED APPLICATIONS

This application is a National Stage of International Application No. PCT/JP2006/315778 filed on Aug. 3, 2006, claiming priority based on Japanese Patent Application No. 2005-227622, filed Aug. 5, 2005, the contents of all of which are incorporated herein by reference in their entirety.

TECHNICAL FIELD

The present invention relates to a light-emitting diode provided with a first conductive type silicon single crystal substrate, a light-emitting section including a first pn junction structure composed of a III-group nitride semiconductor on the silicon single crystal substrate, a first polarity ohmic electrode for a first conductive type semiconductor provided on the light-emitting section and a second polarity ohmic electrode formed on a second conductive type semiconductor on the same side as the light-emitting section with respect to the silicon single crystal substrate, and a light-emitting diode lamp using the light-emitting diode.

BACKGROUND ART

To obtain a pn junction type light-emitting diode (LED) which operates stably for a long period of time, it is important to provide technical means capable of preventing a reverse overcurrent from accidentally passing to a pn junction type light-emitting section due to, for example, static electricity. Conventionally, a method of electrically protecting the LED by connecting an electronic part such as a Zener diode to the LED has often been used for the purpose of improving an electric breakdown property of the LED. Especially for a gallium nitride (GaN) base or aluminum phosphide gallium indium (AlGaInP) base LEDs provided with a pn junction type light-emitting section composed of a thin compound semiconductor layer, means for purposely adding and incorporating a Zener diode to/in an LED drive electric circuit and improving a breakdown voltage property is disclosed (see JP-A 2005-20038 (Patent Document 1)).

Furthermore, JP-A 2005-57228 (Patent Document 2) and JP-A 2000-188425 (Patent Document 3) disclose a technique of improving a breakdown voltage property of an LED by providing an LED drive power circuit in which capacitors and resistors are incorporated in a complicated way.

Furthermore, a technique of improving a breakdown voltage property against an LED reverse voltage by providing a pn junction type LED and a pn junction type protective diode independently of the LED and electrically connecting them in parallel (see JP-A SHO 52-61982 (Patent Document 4)). Furthermore, in addition to the above described technique of providing a pn junction type protective diode as a single element independent of the LED, technical means for avoiding a reverse overvoltage from applying to a pn junction type light-emitting section by providing a pn junction type protective diode on the same substrate adjacently and separately is also disclosed (see JP-A HEI 10-200159 (Patent Document 5)).

However, of the above described prior arts, Patent Documents 1 to 3 require a space for adding an electronic part to the power circuit to improve the breakdown voltage property of the Zener diode and capacitor or the like, which results in a problem that the size of the LED is increased uselessly. Furthermore, increasing the number of electronic parts incorporated in the power circuit to further improve the breakdown voltage property results in a problem of further complicating the circuit assembly technique and making it unavoidable to increase LED manufacturing cost.

Furthermore, as shown in Patent Documents 4 and 5, when a protective diode is used as a single part separately and at the same time electrically connected in parallel to improve the breakdown voltage property against a reverse current which passes to the pn junction type light-emitting section accidentally, a space for arranging the protective diode is required and the chip size of the LED bonded naturally increases. Furthermore, in order to display the function of electrically protecting the pn junction type light-emitting section from an accidental reverse overcurrent, the protective diode provided separately from the LED needs to be provided with an electrode for operating the protective diode itself is necessary in addition to the electrode necessary to pass an operating current to the light-emitting section of the LED. For example, a total of three (see FIG. 4 in Patent Document 4) or a total of four (see FIG. 1 in Patent Document 4) input and output electrodes need to be formed at most for the LED with the pn junction type protective diode as a single unit described in above Patent Document 4, which undoubtedly complicates the process of manufacturing the LED.

On the other hand, means for obtaining an LED having an excellent breakdown voltage property may also be considered which includes a pn junction structure having an operation of protecting, for example, the light-emitting section of the LED from an overcurrent accidentally applied in a reverse direction. This technical means can simply provide an LED having a high breakdown voltage property without purposely adding electronic parts for improving the breakdown voltage property, for example, a protective diode outside the element such as the LED. However, when a semiconductor material having a relatively narrow forbidden width such as silicon single crystal (silicon) as a substrate to form the pn junction structure, the breakdown voltage property of the LED may be improved, but it takes ingenuity to design the structure of the LED as well as the configuration of electrodes for the LED in order to avoid absorption of emitted light by the silicon substrate or the like and obtain an LED with excellent light-emitting intensity.

The present invention has been proposed in view of the above described problems and it is an object of the present invention to provide a light-emitting diode and light-emitting diode lamp capable of reducing the size and cost even when a breakdown voltage is improved and also eliminating the necessity for any protective diode and having excellent light-emitting intensity.

DISCLOSURE OF THE INVENTION

1) In order to attain the above described object, a first invention is a light-emitting diode including a first conductive type silicon single crystal substrate, a light-emitting section including a first pn junction structure made of III-group nitride semiconductor on the silicon single crystal substrate, a first polarity ohmic electrode formed on a first conductive type semiconductor provided on the light-emitting section, and a second polarity ohmic electrode formed on a second conductive type semiconductor on the same side as the light-emitting section with respect to the silicon single crystal substrate, wherein a second pn junction structure is constructed in a region which extends from the first conductive type silicon single crystal substrate to the light-emitting section, a light-reflecting hole is provided in the silicon single crystal substrate from the back surface of the substrate opposite to the side on which the light-emitting section of the silicon single crystal substrate is provided toward the stacking direction, and the inner surface of the light-reflecting hole and the back surface of the silicon single crystal substrate are coated with a metallic film.

2) A second invention is the configuration of the invention described above in 1), wherein the second pn junction structure is formed of a first conductive type silicon single crystal substrate and a second conductive type semiconductor layer made of a semiconductor material provided joined to the surface of the silicon single crystal substrate allowing light emitted from the light-emitting section to pass through.

3) A third invention is the configuration of the invention described above in 1), wherein the second pn junction structure is formed of a first conductive type semiconductor layer provided on the surface of a first conductive type silicon single crystal substrate, made of a first conductive type semiconductor material allowing light emitted from the light-emitting section to pass through, and a second conductive type semiconductor layer provided joined to the first conductive type semiconductor layer, made of a second conductive type semiconductor material allowing light emitted from the light-emitting section to pass through.

4) A fourth invention is the configuration of the invention described above in any one of 1) to 3), wherein the light-reflecting hole is a through hole which penetrates from the back surface of the substrate toward an upper layer provided joined to the silicon single crystal substrate and the under surface of the upper layer facing the through hole forms part of the inner surface of the light-reflecting hole.

5) A fifth invention is the configuration of the invention described above in any one of 1) to 4), wherein the metallic film with which the back surface of the substrate is coated is made of a metallic material exhibiting an ohmic contact property with respect to the silicon single crystal substrate.

6) A sixth invention is the configuration of the invention described above in 5), wherein the metallic film with which the inner surface of the light-reflecting hole is coated is made of a metallic material exhibiting an ohmic contact property with respect to the silicon single crystal substrate.

7) A seventh invention is the configuration of the invention described above in any one of 1) to 5), wherein the metallic film with which the inner surface of the light-reflecting hole is coated and the metallic film with which the back surface of the substrate is coated are made of different metallic materials.

8) An eighth invention is the configuration of the invention described above in 7), wherein the metallic film with which the inner surface of the light-reflecting hole is coated is made of a metallic material having higher reflectivity than the metallic film with which the back surface of the substrate is coated with respect to the light emitted from the light-emitting section.

9) A ninth invention is a light-emitting diode lamp made up of the light-emitting diode described above in any one of 1) to 8).

10) A tenth invention is the configuration of the invention described above in 9), wherein the first polarity ohmic electrode is connected equipotentially to at least the metallic film of the back surface of the substrate of the metallic films.

11) An eleventh is the configuration of the invention described above in 9) or 10), wherein the first polarity ohmic electrode, the metallic film and a supporter which fixes the light-emitting diode and electrically contacts the metallic film are connected equipotentially.

The present invention provides a light-emitting diode including a first conductive type silicon single crystal substrate, a light-emitting section including a first pn junction structure made of III-group nitride semiconductor on the silicon single crystal substrate, a first polarity ohmic electrode formed on a first conductive type semiconductor provided on the light-emitting section, and a second polarity ohmic electrode formed on a second conductive type semiconductor on the same side as the light-emitting section with respect to the silicon single crystal substrate, wherein a second pn junction structure is constructed in the region which extends from the first conductive type silicon single crystal substrate to the light-emitting section, a light-reflecting hole is provided on the silicon single crystal substrate from the back surface of the substrate opposite to the side on which the light-emitting section of the silicon single crystal substrate is provided toward the stacking direction, and the inner surface of the light-reflecting hole and the back surface of the silicon single crystal substrate are coated with a metallic film, and can thereby simply provide an LED (light-emitting diode) with a high breakdown voltage property using the second pn junction structure without purposely adding any electronic parts to improve the breakdown voltage property of a protective diode or the like outside and reduce the size and cost even when the breakdown voltage is improved. Furthermore, by coating the inner surface of the light-reflecting hole with a metallic film, the present invention causes light emitted from the light-emitting section to be reflected in a direction of taking out the emitted light, and can thereby take out the emitted light efficiently and provide a light-emitting diode with excellent light-emitting intensity.

Furthermore, the present invention provides a metallic film made of a metallic material having ohmic contact with a silicon single crystal on a back surface of a first conductive type silicon crystal substrate, electrically connects this metallic film and a first polarity ohmic electrode so as to be substantially equipotential and manufactures an LED lamp (light-emitting diode lamp), and can thereby two-dimensionally and efficiently distribute a reverse overcurrent accidentally generated due to static electricity or the like, cause the overcurrent to flow at a low density and simply provide an LED lamp with an excellent breakdown voltage property without purposely adding any electronic parts such as a protective diode as in the case of the prior art.

Moreover, the present invention configures an LED lamp by equipotentially connecting a metallic film, a region of a supporter for supporting the LED to make a lamp and the first polarity ohmic electrode, and can thereby prevent a reverse overcurrent from accidentally flowing into the light-emitting section of the LED due to static electricity or the like and provide a high brightness LED lamp with an excellent reverse breakdown voltage property.

BEST MODE FOR CARRYING OUT THE INVENTION

The present invention uses an n-type or p-type silicon (Si) single crystal (silicon) as a substrate. For example, suppose an n-type or p-type silicon single crystal whose surface is a [111] crystal surface is used as a substrate. Furthermore, an n-type or p-type silicon single crystal whose surface is a [001] crystal surface or a crystal surface inclined therefrom is also used as a substrate. Here, the conductive type of the silicon single crystal is a first conductive type referred to in the present invention. A high resistance p-type or n-type silicon single crystal may also be used a substrate (high resistance p-type or n-type semiconductor may also be referred to as a π-type or ν-type (see "Optical Communication Device Engineering—Light-Emitting Device and Photodetector" Hiroo Yonezu, May 20, 1995, Kogakutosho Publishing Inc., fifth edition, footnote on p. 317)), but a low resistance conductive p-type or n-type silicon single crystal is preferably used as a substrate to configure an LED or a laser diode (LD).

A second pn junction structure is formed on the substrate made of a first conductive type silicon single crystal to prevent a reverse overcurrent from flowing into the light-emitting section of the LED. The second pn junction structure to improve this reverse breakdown voltage is provided in a region which extends from the first conductive type silicon single crystal substrate to a light-emitting section for an LED provided thereon. The pn junction structure can be formed of a first conductive type (conductive type) silicon single crystal substrate and a semiconductor layer made of a second conductive type semiconductor material provided joined to the surface thereof which is opposite to the first conductive type.

If the first conductive type is, for example, a p-type, the second conductive type is an n-type, and therefore a second pn junction is formed of a p-type silicon single crystal substrate and an n-type semiconductor layer provided joined to the surface of the substrate. Furthermore, for example, a high resistance p-type (π-type) semiconductor layer is provided on an n-type silicon single crystal substrate to form a pn junction structure. Furthermore, as another example, a second pn junction structure is formed of a p-type silicon single crystal substrate and a high resistance n-type semiconductor layer (ν-type) provided joined thereto.

Furthermore, the second pn junction structure provided in a region which extends from the first conductive type silicon single crystal substrate to the light-emitting section thereon can also be configured with a semiconductor layer made of a first conductive type material formed on the first conductive type silicon single crystal substrate and a semiconductor layer made of a second conductive type semiconductor material provided joined thereto. That is, the second pn junction structure can be formed of a stacked configuration made of a first conductive type silicon single crystal substrate/first conductive type semiconductor layer/second conductive type semiconductor layer (symbol "/" denotes junction).

In the following explanations, expressions "first and second conductive type semiconductor layers" are used, but when the second pn junction structure is configured with the first conductive type silicon single crystal substrate and the second conductive type semiconductor layer, with regard to semiconductor layers, suppose the first and second conductive type semiconductor layers only means a second conductive type semiconductor layer because the first conductive type is a single crystal substrate.

The first and second conductive type semiconductor layers are configured with a semiconductor material with a high forbidden band gap (Eg) which allows light emitted from the light-emitting section of the LED to fully pass through. For example, the first and second conductive type semiconductor layers can be configured with a cubic crystal 3C-type (Eg=2.4 eV) or hexagonal crystal 4H-type (Eg=3.3 eV) or 6H-type (Eg=3.0 eV) silicon carbide (SiC). The first or second conductive type silicon carbide layer can be formed using, for example, a chemical vapor deposition (CVD) method. It can also be formed using means for irradiating a hydrocarbon base gas such as acetylene (molecular formula: $C_2H_2$) onto the surface of silicon single crystal in high vacuum. A [001]-oriented 3C-type SiC layer of cubic crystal can be formed using a silicon single crystal substrate whose surface is the [001] crystal surface. A [111]-oriented 3C-type SiC layer can be formed using a silicon single crystal substrate whose surface is the [111] crystal surface.

Furthermore, the first and second conductive type semiconductor layers can also be composed of a boron phosphide (BP) base compound semiconductor material. The boron phosphide base compound semiconductor refers to III to V-group compound semiconductor containing boron (element symbol: B) and phosphorus (element symbol: P) as components. It is, for example, boron phosphide gallium (composition formula $B_YGa_{1-Y}P$: $0<Y\leq1$) and boron phosphide indium (composition formula $B_ZIn_{1-Z}P$: $0<Z\leq1$). Furthermore, monomeric BP having a forbidden band gap of 2.0 eV or more at a room temperature can be taken as an example.

The first and second conductive type boron phosphide base semiconductor layers can be formed using a metal organic chemical vapor deposition (MOCVD) method, halogen vapor phase epitaxial (VPE) method, hydride VPE method, or an epitaxial growth method such as molecular beam epitaxial (MBE) method. In particular, the MOCVD method which is commonly used for growth of a compound semiconductor thin film containing phosphorus (P) as a component is suitably used. The first and second conductive type boron phosphide base compound semiconductor layers having resistivity and a layer thickness, which give a desired reverse breakdown voltage, can also be a (undoped) layer without any intentionally added impurities. Furthermore, it can also be a so-called impurity doping layer with intentionally added p-type impurities or n-type impurities during the growth.

The first and second conductive type semiconductor layers can be composed of a III-group nitride semiconductor material having a wide forbidden gap width at a room temperature. For example, the first and second conductive type semiconductor layers can be composed of wurtzite crystal type gallium nitride (GaN) (Eg=3.4 eV), zinc blende crystal GaN (Eg=3.2 eV), and nitride semiconductor mix crystal containing aluminum (Al) such as aluminum nitride (AlN) (Eg=5.9 eV), aluminum indium nitride (composition formula $Al_QIn_{1-Q}N$: $0<Q<1$). When the light-emitting section of the LED made of a III-group nitride semiconductor material is configured on the second conductive type semiconductor layer, if the second conductive type semiconductor layer is configured with the III-group nitride semiconductor material, it is possible to produce a high-quality III-group nitride semiconductor layer suitable for configuring the light-emitting section because lattice mismatch hardly occurs.

The second conductive type semiconductor layer forming a second pn junction structure joined to the first conductive type silicon single crystal substrate or the first and second conductive type semiconductor layers forming a second pn junction preferably have such carrier concentration (or resistivity (specific resistance) and layer thickness that bring about a convenient reverse breakdown voltage property. The resistivity of the first and second conductive type semiconductor layers or carrier concentration ($n(cm^{-3})$ or $p(cm^{-3})$) inversely proportional to the resistivity and layer thickness ($d(cm)$) are adjusted in such a way that the pn junction structure becomes convenient to realize a preferable reverse breakdown voltage. For example, the first and second conductive type semiconductor layers preferably have resistivity (=specific resistance) of less than $1\times10^4 \Omega \cdot cm$, a layer thickness of several tens of μm or less or more preferably 10 μm or less. When the first and second conductive type semiconductor layers are configured with a semiconductor material with extremely high resistance and extremely large layer thickness, conduction resistance increases and produces the inconvenience that it is not possible to cause the reverse overcurrent to pass through the first conductive type silicon single crystal substrate, bypass the light-emitting section of the LED and effectively escape to the second polarity ohmic electrode which will be described later.

The reverse breakdown voltage ($=V_B$) that the second pn junction structure according to the present invention should have is higher than the forward voltage (so-called $V_F$ of the first pn junction which makes up the light-emitting section) of the LED and also falls within a range smaller than the reverse voltage (so-called $V_R$ of the pn junction which makes up the light-emitting section). For example, $V_B$ exceeds twice the forward voltage ($V_F$ (unit: V)) of the LED when the forward current is assumed to be 10 μA and preferably smaller than ½ of the reverse voltage ($V_R$ (unit: V)) of the LED (here, refers to the reverse voltage when a current of 10 μA is passed). That is, it is preferable to adopt a pn junction structure having a reverse breakdown voltage ($V_B$) which gives a magnitude relationship of $0.5 \cdot V_R > V_B > 2.0 \cdot V_F$.

The LED according to the present invention is configured by including a second pn junction structure having a breakdown voltage ($V_B$) property provided on the first conductive type silicon single crystal substrate, a first polarity ohmic electrode formed on the first conductive type semiconductor layer on the first conductive type semiconductor layer or light-emitting section making up the light-emitting section thereon and a second polarity ohmic electrode on the second conductive type semiconductor layer opposite to the first one which makes up the second conductive type semiconductor layer or light-emitting section making up the second pn junction structure. The first conductive type refers to a conductive type of a silicon single crystal which makes up the substrate, and therefore the first polarity ohmic electrode is provided on the same first conductive type semiconductor layer as the silicon single crystal substrate.

Though the second polarity ohmic electrode for making up the LED of the present invention should be arranged on the same surface side of the silicon single crystal substrate, it is formed on the second conductive type semiconductor layer located at a position different in the vertical direction (vertical direction of the LED) from the first conductive type semiconductor layer provided with the first polarity ohmic electrode. While the first polarity electrode is provided on the first conductive type semiconductor layer stacked above the light-emitting layer provided for the pn junction-type light-emitting section, the second polarity ohmic electrode is provided on the second conductive type semiconductor layer below the light-emitting layer. For example, the second polarity ohmic electrode is provided in contact with a second conductive type lower clad layer, a second conductive type buffer layer which is a base layer for providing the lower clad layer or a second conductive type Bragg reflection layer.

When the first polarity ohmic electrode is an anode (positive pole, (+) pole), the corresponding second polarity ohmic electrode becomes a cathode (negative pole, (−) pole). When the first conductive type is an n-type, the first polarity ohmic electrode provided on this n-type semiconductor layer becomes a cathode. Conversely, the second polarity ohmic electrode becomes an anode. When the first conductive type is a p-type, the first polarity ohmic electrode becomes an anode, and therefore the second polarity ohmic electrode becomes a cathode.

The first polarity ohmic electrode can be formed as a pad electrode made of an ohmic metallic film provided on the surface of the semiconductor layer to apply bonding which provides substantially the same potential as that of a conductor. Furthermore, the configuration can also be realized with the pad electrode and the first polarity ohmic electrode which is made electrically continuous with the pad electrode and spread over the surface of the first conductive type semiconductor layer on the light-emitting layer or light-emitting section. Arranging the first polarity ohmic electrode spread over substantially the whole surface of the first conductive type semiconductor layer makes it possible to produce an effect of two-dimensionally distributing the drive current in the forward direction for causing the LED to emit light.

The forward current is a current which flows, when the first polarity ohmic electrode is the anode and the second polarity ohmic electrode is the cathode, between both polarity ohmic electrodes when a positive voltage is applied to the anode and a voltage lower than the positive voltage is applied to the cathode. It is also a current which flows, when the first polarity ohmic electrode is the cathode and the second polarity ohmic electrode is the anode, between both polarity ohmic electrodes when a negative voltage is applied to the cathode and a voltage higher than the negative voltage is applied to the anode.

When the first polarity ohmic electrode is arranged uniformly over the surface of the first conductive type semiconductor layer in addition to the pad electrode for bonding and the forward current for producing light emission from the LED is spread over the light-emitting section through the first conductive type semiconductor layer, the electrode to be spread and the pad electrode need to be electrically continuous, but the pad electrode need not always be made of a metallic film having ohmic contact with respect to the first conductive type semiconductor layer. When the pad electrode is composed of a material that forms non-ohmic contact with respect to the first conductive type semiconductor layer, contact resistance between the pad electrode and the first conductive type semiconductor layer increases, preventing a current from flowing like a short-circuit to the light-emitting section through the first conductive type semiconductor layer.

The pad electrode provided so as to be electrically continuous with the first polarity ohmic electrode is composed of a thick metallic film of approximately several μm to prevent extension of mechanical shock or thermal shock when bonding is applied thereto to the first conductive type semiconductor layer or to the light-emitting section which emits light. For this reason, light emitted from the light-emitting section in the projection region of the pad electrode is shielded by the thick metallic film making up the pad electrode and cannot be taken out of the LED. Therefore, if the pad electrode is composed of a material having a non-ohmic property with respect to the first conductive type semiconductor layer, passage of a short-circuit like forward current to the light-emitting section in the projection region of the pad electrode is blocked and then the forward current is two-dimensionally spread over the first conductive type semiconductor layer through the extended electrode which is electrically continuous with the pad electrode, a high brightness LED with high photoelectric conversion efficiency can be obtained.

The first polarity ohmic electrode which is made electrically continuous with the pad electrode and spread over the first conductive type semiconductor layer is arranged on the surface of the first conductive type semiconductor layer or by extension arranged so as to homogeneously spread the forward current over the light-emitting section therebelow. For example, the first polarity ohmic electrode can be composed of an ohmic metallic film formed using a photolithography technique on a lattice-, mesh-, concentric- or frame-shape in a plan view. It is also composed of an electrode in a shape which allows the forward current to flow to the first conductive type semiconductor layer at a uniform current density. For example, it is configured in a lattice shape narrowed as the distance from the pad electrode to the second polarity ohmic electrode increases or in a concentric shape whose diameter is gradually reduced in proportion to the distance.

In order to arrange the second polarity ohmic electrode on the second conductive type semiconductor layer located on the silicon single crystal substrate side below the light-emitting layer or light-emitting section, the light-emitting section which exists in the region for providing the ohmic electrode needs to be removed. That is, it is necessary to remove a partial region of the light-emitting section which produces light emission and provide the region producing light emission with the area thereof reduced. For this reason, it is beneficial to use an electrode having a minimum planar area necessary to allow bonding as the second polarity ohmic electrode and avoid the region of the light-emitting section to be removed from increasing excessively when obtaining a high brightness LED. For example, the second polarity ohmic electrode can be composed of only the pad electrode necessary for bonding. As the pad electrode also serving as the second polarity ohmic electrode, it is possible to take a metallic electrode in a circular shape having a diameter of 80 µm to 150 µm in a plan view or a square shape, each side having a length of 80 µm to 150 µm in a plan view as an example.

A further feature in configuring the LED according to the present invention is that a light-reflecting hole is provided in the back surface of the first conductive type silicon single crystal substrate (surface opposite to the side on which the light-emitting section is provided).

Figure 1:
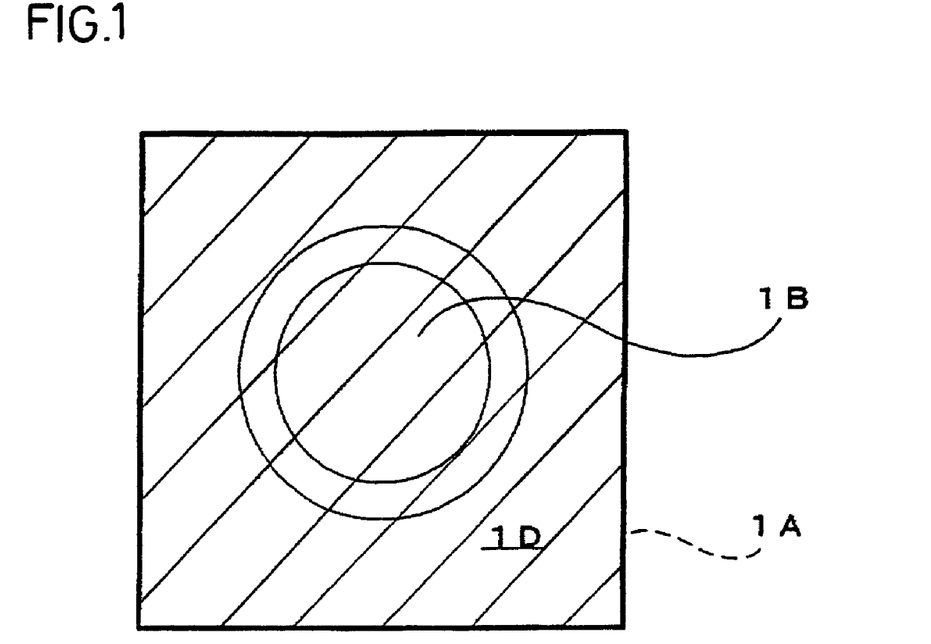
FIG. 1 is a schematic plan view illustrating a light-reflecting hole according to the present invention.

FIG. 1 shows a schematic plan view of the back surface of a silicon single crystal substrate 1A provided with a light-reflecting hole 1B. Only one light-reflecting hole 1B may be provided in the center of the back surface of the silicon single crystal substrate as shown in the schematic plan view of FIG. 1. Furthermore, cylindrical holes of the same opening diameter may also be provided uniformly at a plurality of locations in the surface of the substrate. The horizontal cross-sectional shape of the light-reflecting hole is not limited to a circular shape and can also be square such as rectangle or polygonal such as hexagon. The light-reflecting hole 1B can be formed by applying patterning so as to obtain the light-reflecting hole 1B of a desired horizontal cross-sectional shape using a photolithography technique and then using a wet etching method using hydrofluoric acid (HF) or the like.

Figure 2:
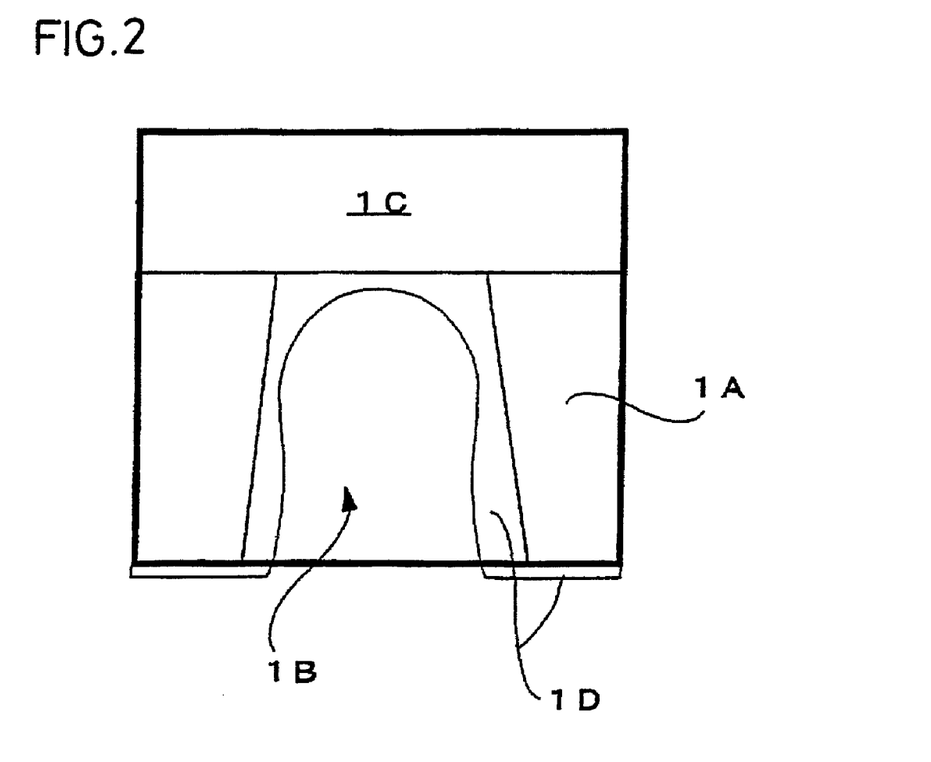
FIG. 2 is a schematic cross-sectional view of the light-reflecting hole described in FIG. 1.

FIG. 2 is a vertical cross-sectional view schematically showing a cross-sectional structure of the light-reflecting hole 1B. A thin-film layer made of silicon single crystal may be left in the closed upper wall of the light-reflecting hole 1B, but the light-reflecting hole 1B is most preferably a through hole which penetrates from the back surface of the substrate toward the upper layer (first or second conductive type semiconductor layer) 1C provided joined to the silicon single crystal substrate. In the case of a through hole, the under surface of the upper layer 1C facing the through hole forms part (closed upper wall) of the inner surface of the light-reflecting hole 1B. Though shown together with FIG. 2, a metallic film 1D is adhered to the inner surface of the light-reflecting hole 1B and the back surface of the silicon single crystal substrate 1A. The metallic film 1D adhered to the closed upper wall of the light-reflecting hole 1B opposed to the light-emitting section has an operation of reflecting the light emitted from the light-emitting section in the direction in which the emitted light is taken out. Therefore, the metallic film 1D is preferably configured with a metallic material having high reflectivity for light emission from the light-emitting section. For example, it is configured with aluminum (element symbol: Al), silver (element symbol: Ag) or gold (element symbol: Au). The light-reflecting hole 1B is preferably made of a through hole so that light is efficiently reflected by this closed upper wall.

Furthermore, the metallic film 1D with which the silicon single crystal substrate 1A is coated has an effect of improving electrical contact between the supporter for supporting an LED chip for configuring the LED lamp which will be described later and the silicon single crystal substrate. Especially, when the metallic film 1D is configured with a metallic material which makes ohmic contact with respect to silicon, the contact resistance between the supporter and silicon single crystal substrate is reduced, and it is thereby possible to produce an effect of causing a reverse overcurrent to efficiently escape to the second polarity ohmic electrode through the interior of the silicon single crystal substrate without passing through the light-emitting section. Examples of ohmic material for the silicon single crystal include aluminum (Al) and gold (Au).

The metallic film adhered to the inner surface of the light-reflecting hole may be the same metallic film as the metallic film adhered to the back surface of the silicon single crystal. For example, both the inner surface of the light-reflecting hole and the back surface of the silicon single crystal may be coated with a metallic material which makes ohmic contact with respect to the silicon single crystal. Coating both the light-reflecting hole and the back surface of the silicon single crystal with a material which makes ohmic contact causes the ohmic-contacting region to expand and can thereby allow a reverse overcurrent to flow distributed inside the silicon single crystal substrate. This can reduce the density of reverse current flowing into the silicon single crystal substrate and configure an LED with an excellent breakdown voltage property.

Furthermore, the metallic film adhered to the inner surface of the light-reflecting hole and the metallic film adhered to the back surface of the silicon single crystal may be configured with different metallic materials. In this case, the metallic film with which the inner surface of the light-reflecting hole is coated is preferably configured with a metallic material having high reflectivity with respect to light emitted from the light-emitting section of the LED. Especially, the metallic film with which the inner surface of the light-reflecting hole is coated is preferably configured with a metallic material which can reflect light emitted from the light-emitting section with higher efficiency than the ohmic contact metal with which the back surface of the silicon single crystal is coated. An example of this may be a configuration in which the region of the back surface of the silicon single crystal other than the light-reflecting hole is coated with an aluminum film and the inner surface of the light-reflecting hole is coated with a silver (Ag) film. Coating the bottom surface of the light-reflecting hole located at a position facing the light-emitting section with such a high reflectivity metallic film is advantageous in obtaining a high brightness LED.

The LED lamp according to the present invention is manufactured by electrically connecting the positive or negative first polarity ohmic electrode provided on the light-emitting section equipotentially to the metallic film provided on the back surface of the first conductive type silicon single crystal of the substrate. The first polarity ohmic electrode on the first conductive type semiconductor layer provided on the light-emitting section can be simply electrically connected substantially equipotentially to the first conductive type silicon single crystal substrate using, for example, a method of bonding them to the same terminal at the same potential and electrically connecting them.

The second pn junction structure according to the present invention is configured in such a way that the reverse breakdown voltage (above described voltage $V_B$) is lower than the reverse voltage (above described voltage $V_R$) of the first pn junction making up the light-emitting section of the LED. Therefore, by realizing electric bonding as described above, it is possible to allow a reverse overcurrent produced when a reverse voltage is applied accidentally to escape out of the LED not through the light-emitting section but through the positive or negative second polarity second ohmic electrode on the second conductive type semiconductor layer. Therefore, it is possible to avoid the light-emitting section of the LED from being destroyed due to the passage of accidental reverse overcurrent and realize an LED lamp with an excellent breakdown voltage property.

A reverse overcurrent can be made to flow more efficiently in a reverse direction to the second polarity ohmic electrode through the silicon single crystal substrate by configuring the metallic film provided with the light-reflecting hole and disposed on the back surface of the silicon single crystal with a metallic material making ohmic contact with the silicon single crystal, reducing the electric resistance against the passage of the reverse overcurrent between the metallic film and the silicon single crystal substrate and applying the above described equipotential bonding. That is, it is possible to produce an effect of obtaining an LED lamp with a further excellent breakdown voltage property.

On the other hand, the pn junction structure according to the present invention is configured so that the breakdown voltage (above described voltage $V_B$) is higher than the forward voltage (above described voltage $V_F$) of the LED having the pn junction type light-emitting section. Therefore, by realizing electrical bonding as described above, it is possible to prevent the drive current flowing normally in the forward direction to cause the LED to emit light from accidentally leaking to the silicon single crystal substrate. Therefore, it is possible to realize an LED lamp having an excellent breakdown voltage property against an accidentally applied reverse overvoltage and also with excellent photoelectric conversion efficiency.

Furthermore, when the metallic film provided on the back surface of the first conductive type silicon single crystal substrate used to configure the LED to manufacture an LED lamp is set to the same potential as that of the region of the supporter which contacts the metallic film, it is possible to configure the lamp having an excellent breakdown voltage property against an accidentally applied reverse overcurrent. It is possible to reduce the density of a reverse overcurrent which flows through the silicon single crystal substrate by causing the metallic film of the back surface of the first conductive type silicon single crystal substrate to make two-dimensional and wide electrical contact with the region of the conductive supporter which supports and fixes the metallic film to make them equipotential. This produces a better effect of further preventing the LED making up the LED lamp from being destroyed by an accidental reverse overcurrent. Even when electrical bonding is applied to cause the metallic film of the back surface of the silicon single crystal substrate to have the same potential as that of the conductive region of the supporter which is in electrical contact with the metallic film, the present invention likewise causes the metallic film of the back surface of the silicon single crystal substrate to have the same potential as that of the first polarity electrode.

EMBODIMENT 1

This Embodiment 1 will more specifically explain the content of the present invention taking a case of manufacturing an LED including a second pn junction structure for improving a breakdown voltage property composed of a p-type silicon single crystal which is a first conductive type used as a substrate and an n-type semiconductor material which is a second conductive type stacked thereon as an example.

Figure 3:
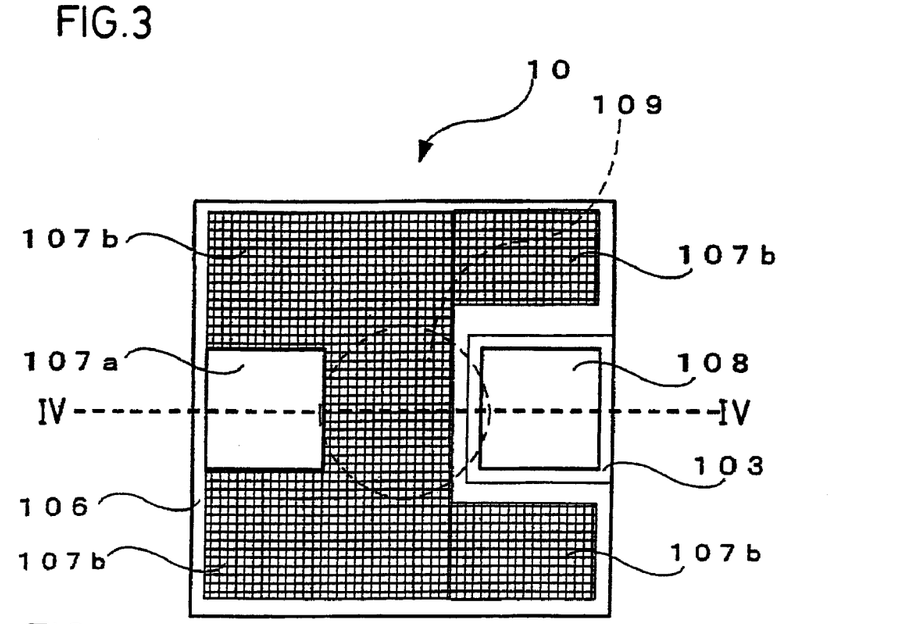
FIG. 3 is a schematic plan view of an LED according to Embodiment 1 of the present invention.
Figure 4:
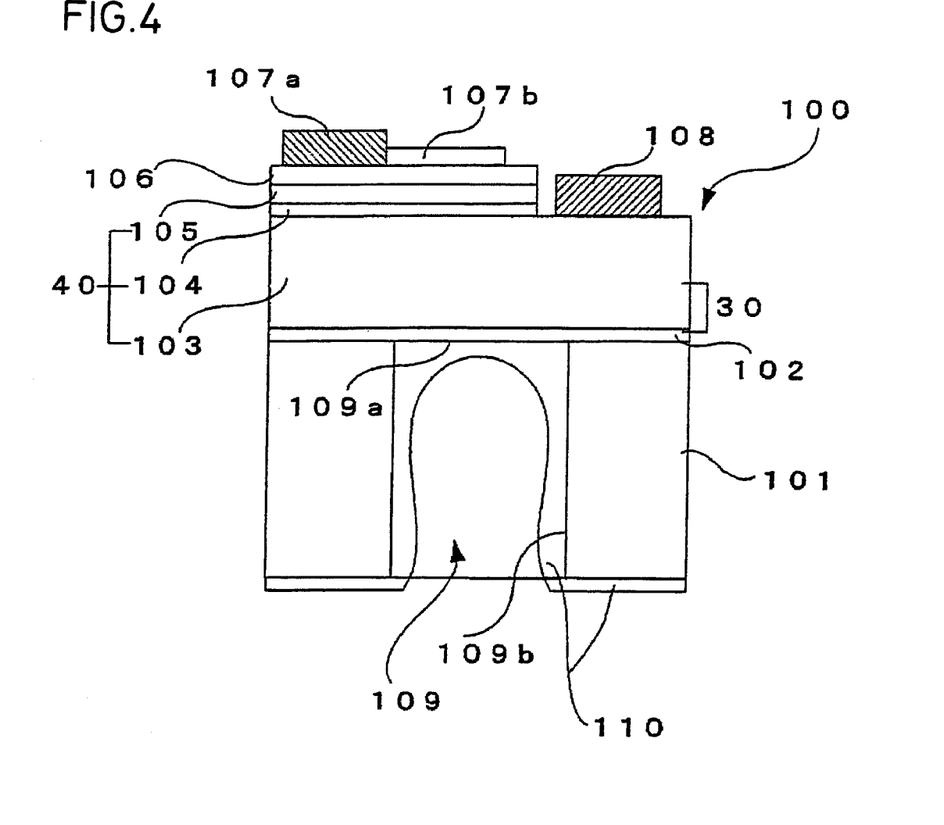
FIG. 4 is a schematic cross-sectional view along a dotted line IV-IV of the LED described in FIG. 3.

FIG. 3 is a schematic plan view of an LED including, in addition to a pn junction provided for a light-emitting section, a second pn junction structure for improving a breakdown voltage property other than the light-emitting section. Furthermore, FIG. 4 is a schematic cross-sectional view along a dotted line IV-IV of the high breakdown voltage type LED shown in FIG. 3.

A stacked structure 100 for manufacturing an LED 10 was formed using a p-type silicon single crystal (therefore, the first conductive type of this Embodiment 1 is a p-type) doped with boron (element symbol: B) and having a (111) crystal surface as a substrate 101. On the surface made up of the (111) crystal surface of the silicon single crystal substrate 101, a p-type silicon carbide (SiC) thin-film layer (layer thickness of approximately 2 nm) 102 was formed. An n-type gallium nitride (GaN) layer (layer thickness of approximately 3 μm, carrier concentration of approximately $4 \times 10^{18}$ cm$^{-3}$) 103 doped with silicon (element symbol: Si) was provided directly joined to the surface of the p-type SiC thin-film layer 102 of the first conductive type. This n-type GaN layer 103 corresponds to the second conductive type (n-type in Embodiment 1) semiconductor layer referred to in the present invention.

A second pn junction structure 30 for avoiding an overcurrent from flowing into a light-emitting section 40 due to an overvoltage accidentally applied in the reverse direction was formed by providing the p-type SiC thin-film layer 102 which is the first conductive type and the n-type GaN layer 103 which is the second conductive type joined together.

Separately, on a boron-doped (111)-silicon single crystal substrate of the same resistivity, carrier concentration and thickness as those used to form the stacked structure 100, a p-type SiC thin-film layer and an n-type GaN layer of the same specification as that described above were in vapor-phase grown and a pn junction was formed. The back surface of the p-type silicon single crystal substrate was coated with an aluminum (element symbol: Al) film using general vacuum evaporation means, sintered and an ohmic electrode was thereby formed. An ohmic electrode made of a lanthanum (element symbol: La) Al alloy vacuum deposition film was formed on the surface of the n-type GaN layer and the reverse breakdown voltage ($V_B$ referred to in the present invention) of this pn junction was measured. When the reverse current was assumed to be 10 μA, the breakdown voltage was approximately 7.1 V.

On the n-type GaN layer 103 which is a component of the pn junction structure 30, a light-emitting layer 104 having a multiple quantum well structure was stacked using an n-type gallium indium nitride mix crystal ($Ga_{1-\alpha}In_\alpha N$: average In composition ratio (=α) is 0.19) layer made up of a plurality of phases having different indium (element symbol: In) composition ratios as a well layer and an n-type aluminum gallium nitride mix crystal ($Al_{0.01}Ga_{0.99}N$) layer as a barrier layer. The light-emitting layer 104 having a multiple quantum well structure was formed assuming that the number of pairs of well layer and barrier layer was 5. On the n-type light-emitting layer 104, an upper clad layer 105 made up of a p-type $Al_{0.05}Ga_{0.95}N$ layer (layer thickness of approximately 50 nm, carrier concentration of approximately $3\times10^{17}$ cm$^{-3}$) was stacked. In this way, a pn junction type double hetero-junction structured light-emitting section 40 was formed of a lower clad layer made of the n-type GaN layer 103, the light-emitting layer 104 and the upper clad layer 105. On the upper clad layer 105, the first conductive type, that is, a p-type GaN layer in this Embodiment 1 was stacked as a contact layer 106.

On the p-type silicon single crystal substrate 101, the above described semiconductor layers 102 to 106 having the first and second conductive types were made to grow in vapor phase using the same molecular beam epitaxial (MBE) method, the formation of the stacked structure 100 was completed, and then from exclusively a region in which a second polarity (cathode in this Embodiment 1) ohmic electrode 108 was provided on the semiconductor layer of a second conductive type (n-type in this Embodiment 1), the semiconductor layers 104 to 106 arranged thereon were removed. For the semiconductor layers 104 to 106, regions patterned using a general photolithography technique were selectively removed using dry etching means.

A second polarity ohmic electrode 108 for a second conductive type semiconductor layer (n-type semiconductor layer in this Embodiment 1) was formed on the surface of the n-type GaN layer 103 exposed using dry etching means. This second polarity (cathode) ohmic electrode which also serves as a pad electrode for bonding was composed of a La.Al alloy vacuum deposition film having a film thickness of approximately 2 μm. The pad electrode 108 which also serves as the second polarity ohmic electrode was shaped into a square, each side having a length of approximately 120 μm in a plan view.

On the other hand, a partial region of the surface of the p-type GaN contact layer 106 of the first conductive type (p-type in this Embodiment 1) which forms the uppermost layer of the stacked structure 100 was provided with a pad electrode 107a for bonding which is a quasi-square in a plan view, made of an alloy film of gold (element symbol: Au) and germanium (element symbol: Ge). Suppose the shape of the pad electrode 107a is a square, each side having a length of approximately 110 μm. Furthermore, an ohmic electrode 107b of first polarity (anode in this Embodiment 1) made of an alloy of Au and nickel (element symbol: Ni) was provided so as to be electrically continuous with the pad electrode for bonding 107a. The first polarity ohmic electrode 107b was arranged in a lattice-like shape (see FIG. 3) so as to substantially uniformly spread an LED drive current over the entire surface of the p-type GaN contact layer 106 of the first conductive type (p-type in this Embodiment 1) remaining after the above described dry etching was applied.

Furthermore, patterning was applied to the back surface of silicon single crystal substrate 101 using a general photolithography technique, the silicon single crystal making up the substrate 101 located in the patterned region was removed by etching and a light-reflecting hole 109 was formed using hydrofluoric acid. The silicon single crystal substrate 101 was subjected to etching until the first conductive type SiC layer 102 was exposed on a closed upper wall 109a of the light-reflecting hole 109. In this way, the light-reflecting hole 109 for which the under surface of the p-type SiC layer 102 serves as the closed upper wall 109a was provided in the center of the silicon single crystal substrate 101. The horizontal cross-sectional shape of the light-reflecting hole 109 penetrating the silicon single crystal substrate 101 was made into a circle and the diameter of the circular cross section was set to approximately 150 μm.

The closed upper wall 109a and side wall 109b of the light-reflecting hole 109 and the back surface of the silicon single crystal substrate 101 other than the light-reflecting hole 109 were coated with an aluminum (Al) film 110 using general vacuum evaporation means so as to cover those surfaces.

After this, these elements were then separated into individual elements (chips) using general cutting means and a square shaped LED 10, each side having approximately 350 μm in a plan view was obtained. When a forward current was passed between the ohmic electrodes 107b and 108 of the LED 10, blue light having a wavelength of approximately 450 nm was emitted from the LED 10 provided with the light-emitting section 40 of a pn junction type hetero-junction structure. The forward voltage ($V_F$) of the LED 10 was 3.5 V when the forward current was set to 20 mA. $V_F$ was 2.9 V when the forward current was set to 10 μA. Furthermore, the reverse voltage of the LED 10 was 15.0 V when the reverse current was set to 10 μA.

EMBODIMENT 2

This Embodiment 2 will more specifically explain the content of the present invention by taking a case of manufacturing an LED lamp having a high breakdown voltage property according to the present invention using the LED 10 described in Embodiment 1 as an example.

Figure 5:
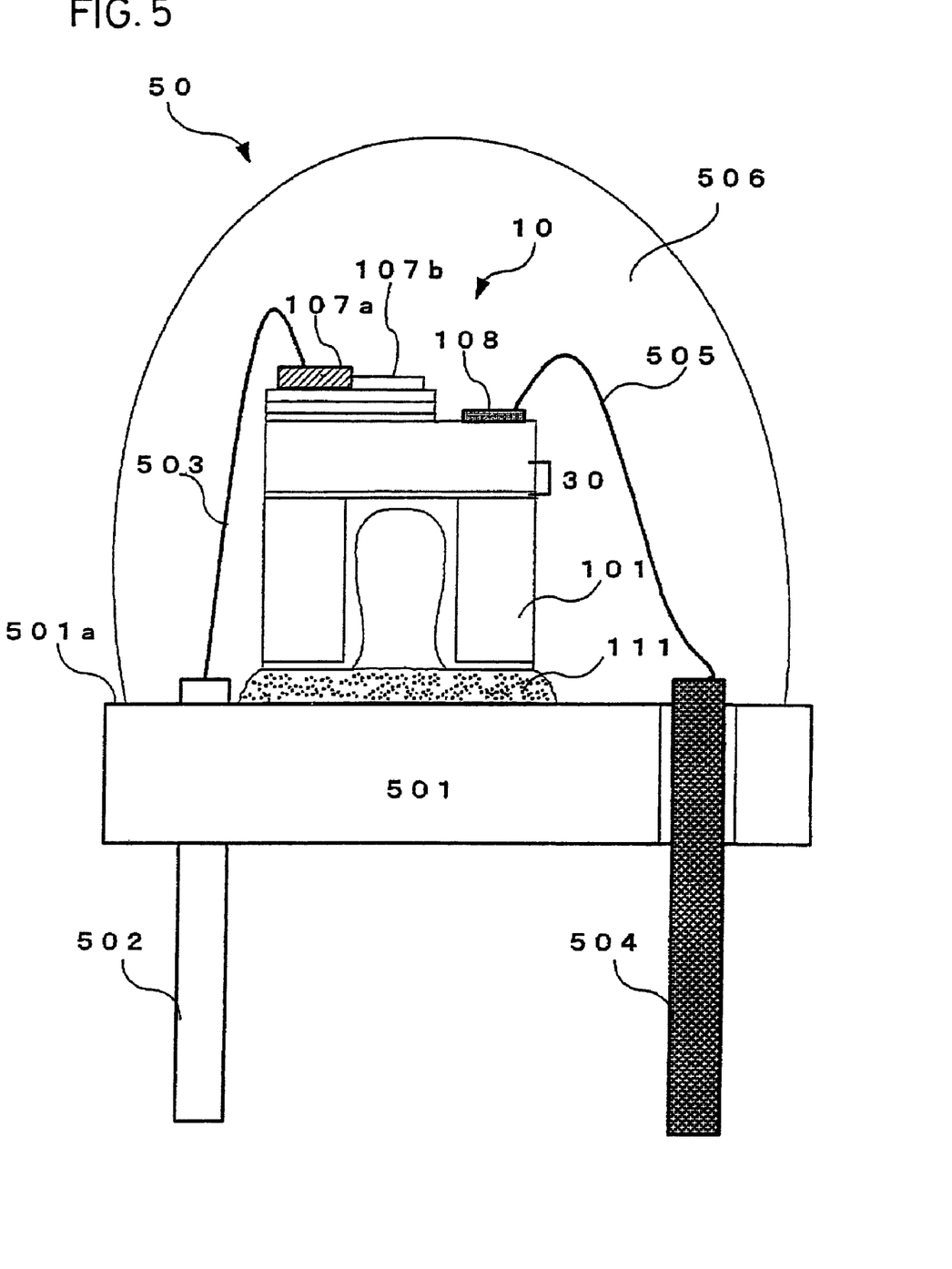
FIG. 5 is a schematic cross-sectional view of the LED lamp according to Embodiment 2 of the present invention.

FIG. 5 schematically shows a cross-sectional structure of an LED lamp 50. In FIG. 5, the same components as those shown in FIG. 3 and FIG. 4 are assigned the same reference numerals.

The LED lamp 50 was manufactured by placing and fixing the chip LED 10 according to Embodiment 1 on a supporter 501. The metallic film 110 on the back surface of the p-type silicon single crystal substrate 101 of the LED 10 was adhered with a general conductive silver (Ag) paste 111 to be electrically continuous with a flat top surface 501a of the supporter 501. Furthermore, an electrode terminal for bonding 502 which is electrically continuous with the top surface 501a of the supporter 501 was electrically connected to the pad electrode 107a of the first polarity according to Embodiment 1 (which is the anode in Embodiment 1 and is also the anode in this Embodiment 2) using a gold (Au) wire 503. This caused the metallic film 110 on the back surface of the silicon single crystal substrate 101 of the first conductive type (p-type in this Embodiment 2) to be equipotential to the lattice-shaped ohmic electrode 107b of the first polarity (anode in this Embodiment 2) which is electrically continuous to the pad electrode 107a.

On the other hand, the ohmic electrode 108 of the second polarity (=cathode) according to Embodiment 1 was electrically connected to another electrode terminal for bonding 504 provided electrically insulated from both the body and the top surface 501a of the supporter 501 using a gold wire 505. That is, bonding was applied to the silicon single crystal substrate 101 of the first conductive type (=p-type) and first polarity ohmic electrode (=anode) so as not to be equipotential to the second polarity ohmic electrode (=cathode). Next, the perimeter of the LED 10 was coated (molded) with general epoxy resin 506 for semiconductor device sealing and the LED lamp 50 was thereby obtained.

A forward current was passed between the electrode terminal 502 which is electrically continuous with both the silicon single crystal substrate 101 of the first conductive type (p-type in this Embodiment 2) and the first polarity ohmic electrode (anode in this Embodiment 2), and the electrode terminal 504 which is electrically continuous with the second polarity ohmic electrode (cathode in this Embodiment 2), and then optical and electrical characteristics of the LED lamp 50 were measured. The wavelength of the main light-emitting spectrum was approximately 450 nm and no particular change from the chip LED 10 according to Embodiment 1 above was observed. The luminous intensity of the LED lamp 50 measured using a general integrating sphere was approximately 2 candelas (cd), approximately 1.5 times the luminous intensity obtained, for a comparison, by applying the above described bonding to the LED configured on the silicon single crystal substrate 101 with no light-reflecting hole or metallic film provided.

Furthermore, the forward voltage ($V_F$) was 3.5 V when a forward current of 20 mA was passed in the forward direction and $V_F$ was 2.9 V when the forward current was set to 10 μA. The reverse voltage ($V_R$) of the LED lamp 50 when the reverse current was set to 10 μA was also approximately 15 V and no particular change was observed in neither forward nor reverse voltage even after applying the above described bonding and molding to realize the LED lamp.

Next, an overvoltage was intentionally added to the LED lamp 50 and a breakdown voltage property thereof was tested. This breakdown voltage property test was conducted using an electric circuit with a capacitor of 100 picofarads (pF) and a resistor of 1.5 kilo-ohm (kΩ) added and with an overvoltage of 500 V to 1000 V added in the reverse direction between both electrode terminals 502 and 504 of the LED lamp 50. After applying the overvoltage, the forward voltage ($V_F$) of the chip LED 10 making up the LED lamp 50 was measured again and the measurement result was approximately 3.6 V which was substantially the same as the value before the breakdown voltage property test. That is, it was proven that even when an overvoltage was intentionally added, the pn junction provided for the light-emitting section 40 was protected from the overcurrent, not destroyed and a normal rectification characteristic was manifested. This was understood to be attributable to the fact that since a pn junction structure 30 of a lower breakdown voltage than the reverse voltage ($V_R$) of the LED 10 was provided right below the light-emitting section 40, even when an overvoltage was applied in the reverse direction, the overcurrent was allowed to flow from the metallic film 110 bonded so that the overcurrent became equipotential to the first polarity ohmic electrode 107b (=anode) into the second polarity ohmic electrode 108 (=cathode) through the silicon single crystal substrate 101 of the first conductive type (=p-type) by bypassing the light-emitting section 40.

EMBODIMENT 3

This Embodiment 3 will more specifically explain the content of the present invention by taking a case of configuring an LED including a second pn junction structure made up of a p-type silicon single crystal substrate which is a first conductive type and an n-type III-group nitride semiconductor layer of a second conductive type stacked thereon for improving a breakdown voltage property as an example.

Figure 6:
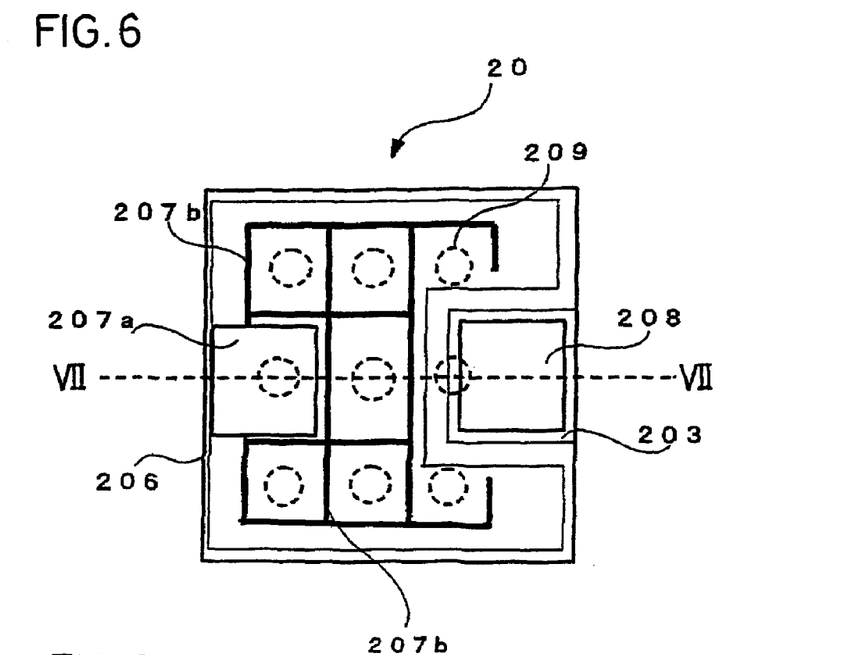
FIG. 6 is a schematic plan view of an LED according to Embodiment 3 of the present invention.
Figure 7:
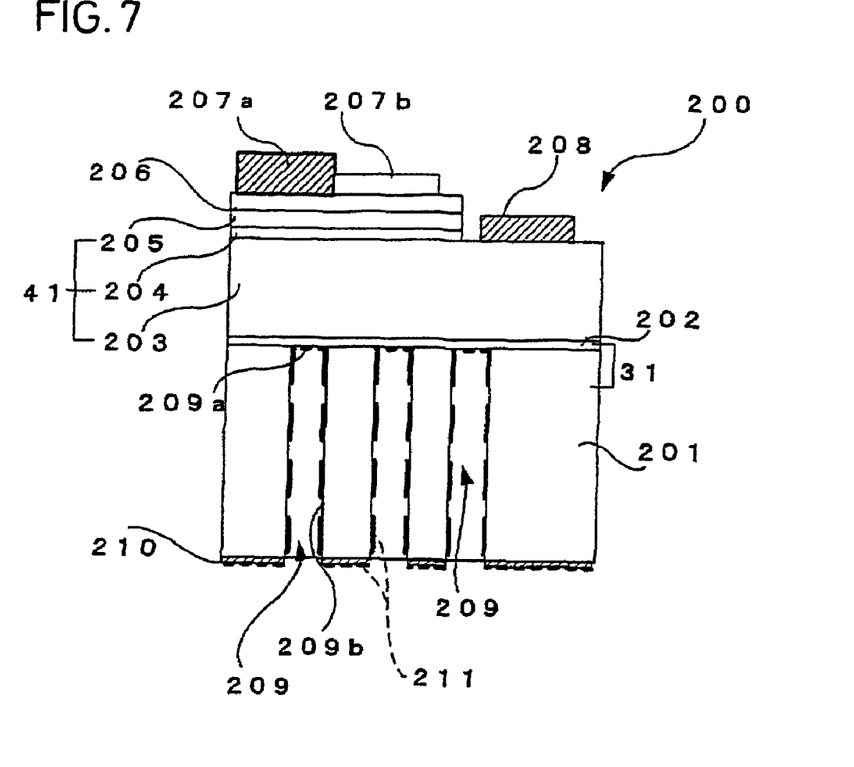
FIG. 7 is a schematic cross-sectional view along a dotted line VII-VII described in FIG. 6.

FIG. 6 is a schematic plan view of an LED 20 including, in addition to a pn junction provided for a light-emitting section, a pn junction structure for improving a breakdown voltage property other than the light-emitting section manufactured in this Embodiment 3. Furthermore, FIG. 7 is a schematic cross-sectional view along a dotted line VII-VII of the high breakdown voltage type LED 20 shown in FIG. 6.

A stacked structure 200 for manufacturing the LED 20 was formed using a p-type silicon single crystal (therefore, the first conductive type is a p-type in this Embodiment 3) doped with boron (B) and having a (001) crystal surface as a substrate 201.

An n-type AlN thin-film layer (layer thickness of approximately 15 μm) 202 was provided directly joined to the surface made of a (001) crystal surface of a p-type silicon single crystal substrate 201. The n-type AlN thin-film layer 202 of a conductive type opposite to the first conductive type (n-type in this Embodiment 3) was formed using an MBE method. This n-type AlN thin-film layer 202 corresponds to a semiconductor layer of the second conductive type (n-type in this Embodiment 3) referred to in the present invention. In this way, a second pn junction structure 31 for avoiding an overcurrent from flowing into the light-emitting section 41 due to an overvoltage accidentally applied in the reverse direction was formed.

An n-type zinc blende crystal type GaN layer (layer thickness of approximately 2 μm, carrier concentration of approximately $2 \times 10^{18}$ cm$^{-3}$) 203 doped with silicon (Si) was stacked on the surface of the n-type AlN thin-film layer 202.

Separately, on the boron-doped (001) silicon single crystal substrate having the same resistivity, carrier concentration and thickness as those used to form the above described pn junction structure 31, an n-type AlN layer of a second conductive type and an n-type GaN layer having the same specification as that described above were vapor-phase grown using an MBE method and a pn junction structure was thereby formed. A gold (Au) film was coated on the back surface of the first conductive p-type silicon single crystal substrate using general vacuum evaporation means, then sintered and an ohmic electrode was thereby formed. An ohmic electrode made of a titanium (element symbol: Ti) film was formed on the surface of the n-type GaN layer and the reverse breakdown voltage of this pn junction ($V_B$ referred to in the present invention) was measured. The breakdown voltage was approximately 7.4 V when the reverse current was set to 10 μA.

On the n-type cubic crystal GaN layer 203 which is the second conductive type (n-type in this Embodiment 3), an n-type light-emitting layer 204, a p-type upper clad layer 205 and a p-type contact layer 206 described in above Embodiment 1 were sequentially stacked using the MBE method and the stacked structure 200 was thereby formed.

After this, a first polarity ohmic electrode (anode in this Embodiment 3) 207b, and a pad electrode 207a therefor and a second polarity ohmic electrode (cathode in Embodiment 3) 208 were formed using the procedure according to Embodiment 1 as in the case of above described Embodiment 1 and the LED 20 was thereby obtained. In this Embodiment 3, the first polarity ohmic electrodes 207b were arranged in a lattice-like shape as shown in the plan view of FIG. 6 and formed in such a way that the LED drive current spread over substantially the whole surface of the contact layer 206 made of p-type GaN which is the first conductive type.

Furthermore, the back surface of the silicon single crystal substrate 201 was wrapped, polished and the thickness which was originally approximately 300 μm was reduced to approximately 220 μm. Then, the back surface of the silicon single crystal substrate 201 whose thickness was reduced was patterned using a general photolithography technique, the silicon single crystal making up the substrate 201 existing in the patterned region was removed using wet etching means using hydrofluoric acid and a light-reflecting hole 209 was formed. The silicon single crystal substrate 201 was etched until the above described second conductive type AlN layer 202 was exposed on the closed upper wall 209a of the light-reflecting hole 209. In this way, a plurality of light-reflecting holes 209 with the under surface of the n-type AlN layer 202 serving as the closed upper wall 209a were provided in the first conductive type silicon single crystal substrate 201. The horizontal cross-sectional shape of the light-reflecting hole 209 that penetrates the silicon single crystal substrate 201 was made circular and the diameter of the circular cross-section was set to approximately 80 μm. The center on the horizontal cross section of each light-reflecting hole 209 was substantially aligned with the center of each lattice shape of the first polarity ohmic electrode 207b arranged in contact with the surface of the contact layer 206 of the above described p-type GaN.

An aluminum (Al) film 210 was adhered to the back surface of the first conductive type silicon single crystal substrate 201 around the light-reflecting hole 209 using general vacuum evaporation means so as to coat the surface thereof. The closed upper wall 209a and side wall 209b of the light-reflecting hole 209 were not purposely coated with the aluminum film.

On the back surface of the silicon single crystal substrate 201 of the LED 20 which was cut into a chip, a silver (Ag) based paste 211 was impregnated as a substitute for the metallic film along the side wall 209b of the light-reflecting hole 209 so as to reach the closed upper wall 209a of the light-reflecting hole 209. After that, the silver based paste 211 was applied to the entire surface of the back surface of the substrate 201 so as to cover the surface of the metallic film 210 provided on the back surface of the silicon single crystal substrate 201 and then fixed to the supporter described in Embodiment 2 above. As in the case of Embodiment 2 above, bonding was applied in such a way that the p-type silicon single crystal substrate 201 of the first conductive type (p-type in this Embodiment 3) and the first polarity ohmic electrode 207b became equipotential. The second polarity ohmic electrode (cathode in this Embodiment 3) 208 was bonded to the other electrode terminal electrically insulated from the electrode terminal to which the first polarity ohmic electrode 207b was bonded. After the bonding, the perimeter of the LED 20 was molded with epoxy resin for semiconductor device sealing and an LED lamp was thereby formed.

When a forward current of 20 mA was passed in the forward direction between the electrode terminal continuous with the first polarity ohmic electrode and the electrode terminal continuous with the second polarity ohmic electrode, the forward voltage ($V_F$) was approximately 3.6 V. Furthermore, the reverse voltage ($V_R$) was approximately 15.0 V when the reverse current was set to 10 μA. The luminous intensity obtained was approximately 1.4 times that of the LED lamp configured without providing the light-reflecting hole and metallic film on the silicon single crystal substrate.

Thirty lamps were extracted from the manufactured LED lamps and subjected to a breakdown voltage test using the technique described in Embodiment 2. As a result, when an overvoltage of 1000 V was intentionally applied in the reverse direction, the normal rectification characteristic of the first pn junction provided for the light-emitting section was not reproduced and there was no LED lamp whose light-emitting section was judged to be destroyed. That is, it was proven that even when an overvoltage is applied accidentally or intentionally in the reverse direction, a high breakdown voltage LED lamp can be stably provided by including the second pn junction structure having a breakdown voltage ($V_B$) related to $V_F$ and $V_R$ as described in the present invention.

The light-emitting diode according to the present invention allows the size and cost thereof to be reduced even when the breakdown voltage property is improved. Furthermore, by coating the inner surface of the light-reflecting hole with a metallic film and causing light emitted from the light-emitting section to be reflected in the direction in which the emitted light is taken out, it is possible to efficiently take out the emitted light and also provide excellent light-emitting intensity.

The LED lamp according to the present invention can two-dimensionally and efficiently distribute a reverse overcurrent accidentally generated caused by static electricity or the like in the silicon single crystal substrate and allow the overcurrent to flow at a low intensity and also provides an excellent breakdown voltage property.

Furthermore, the LED lamp according to the present invention can avoid a reverse overcurrent from accidentally flowing into the light-emitting section of the LED and provide a very excellent reverse breakdown voltage property.

The invention claimed is:
1. A light-emitting diode comprising:
   a first conductive type silicon single crystal substrate;
   a light-emitting section, including a first pn junction structure composed of a III-group nitride semiconductor, provided on a front surface of the silicon single crystal substrate;
   a thin-film conductive type semiconductor layer provided between the first conductive type silicon single crystal substrate and the III-group nitride semiconductor such that the thin-film conductive type semiconductor layer abuts the front surface of the silicon single crystal substrate and abuts a back surface of the III-group nitride semiconductor;
   a first polarity ohmic electrode formed on a contact layer made of a first conductive type semiconductor which is provided on the light-emitting section; and
   a second polarity ohmic electrode formed on the III-group nitride semiconductor made of a second conductive type semiconductor, the second polarity ohmic electrode formed in contact with a front surface of the III-group nitride semiconductor,
   wherein a second pn junction structure is formed in a region which extends from the first conductive type silicon single crystal substrate to the light-emitting section,
   a light-reflecting hole is provided in the silicon single crystal substrate from a back surface of the silicon single crystal substrate opposite to the front surface on which the light-emitting section of the silicon single crystal substrate is provided toward a stacking direction, and
   an inner surface of the light-reflecting hole and the back surface of the silicon single crystal substrate are coated with a metallic film.

2. The light-emitting diode according to claim 1, wherein the second pn junction structure is formed of the first conductive type silicon single crystal substrate and the thin-film conductive type semiconductor layer made up of another semiconductor of the second conductive type joined to the front surface of the silicon single crystal substrate and the thin-film conductive type semiconductor layer allowing light emitted from the light-emitting section to pass through.

3. The light-emitting diode according to claim 2, wherein the first conductive type silicon single crystal substrate and the contact layer are of a p-type conductive type, and
wherein the III-group nitride semiconductor and the thin-film conductive type semiconductor layer are of a n-type conductive type.

4. The light-emitting diode according to claim 1, wherein the second pn junction structure is formed of the thin-film conductive type semiconductor layer made up of another semiconductor of the first conductive type joined to the front surface of the first conductive type silicon single crystal substrate and the thin-film conductive type semiconductor layer allowing light emitted from the light-emitting section to pass through, and the III-group nitride semiconductor joined to the thin-film conductive type semiconductor layer, made of the second conductive type semiconductor and the III-group nitride semiconductor allowing the light emitted from the light-emitting section to pass through.

5. The light-emitting diode according to claim 4, wherein the first conductive type silicon single crystal substrate, the contact layer and the thin-film conductive type semiconductor layer are of a p-type conductive type, and
wherein the III-group nitride semiconductor is of a n-type conductive type.

6. The light-emitting diode according to claim 1, wherein the light-reflecting hole is a through hole which penetrates from the back surface of the silicon single crystal substrate toward the thin-film conductive type semiconductor layer joined to the front surface of the silicon single crystal substrate and an under surface of the thin-film conductive type semiconductor layer facing the through hole forms part of the inner surface of the light-reflecting hole.

7. The light-emitting diode according to claim 1, wherein the metallic film with which the back surface of the substrate is coated is made of a metallic material exhibiting an ohmic contact property with respect to the silicon single crystal substrate.

8. The light-emitting diode according to claim 7, wherein the metallic film with which the inner surface of the light-reflecting hole is coated is made of a metallic material exhibiting an ohmic contact property with respect to the silicon single crystal substrate.

9. The light-emitting diode according to claim 1, wherein the metallic film with which the inner surface of the light-reflecting hole is coated and the metallic film with which the back surface of the substrate is coated are made of different metallic materials.

10. The light-emitting diode according to claim 9, wherein the metallic film with which the inner surface of the light-reflecting hole is coated is made of a metallic material having higher reflectivity than the metallic film with which the back surface of the substrate is coated with respect to light emitted from the light-emitting section.

11. The light-emitting diode according to claim 9, wherein the metallic film which coats the back surface of the substrate is not disposed on an inside portion of the light-reflecting hole.

12. A light-emitting diode lamp comprising the light-emitting diode according to claim 1.

13. The light-emitting diode lamp according to claim 12, wherein the first polarity ohmic electrode is connected equipotentially to at least the metallic film of the back surface of the substrate of the metallic films.

14. The light-emitting diode lamp according to claim 12, wherein the first polarity ohmic electrode, the metallic film and a supporter which fixes the light-emitting diode and electrically contacts the metallic film are connected equipotentially.

15. The light-emitting diode according to claim 1, wherein said second pn junction includes said first conductive type silicon single crystal substrate.

* * * * *